US010151048B1

(12) United States Patent
Wu et al.

(10) Patent No.: US 10,151,048 B1
(45) Date of Patent: Dec. 11, 2018

(54) MANUFACTURING METHOD OF EPITAXIAL CONTACT STRUCTURE IN SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Wan-Chi Wu, Tainan (TW); Hui-Ling Chuang, Changhua (TW); Chih-Chi Cheng, Tainan (TW); Chiu-Hsien Yeh, Tainan (TW); Chien-Cheng Tsai, Kaohsiung (TW); Hung-Jung Yan, Penghu County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/825,127

(22) Filed: Nov. 29, 2017

(30) Foreign Application Priority Data

Nov. 10, 2017 (CN) .......................... 2017 1 1103867

(51) Int. Cl.
H01L 21/00 (2006.01)
C30B 25/18 (2006.01)
H01L 27/108 (2006.01)
G11C 11/4094 (2006.01)
H01L 21/02 (2006.01)
G11C 11/4097 (2006.01)

(52) U.S. Cl.
CPC ...... *C30B 25/186* (2013.01); *H01L 21/02293* (2013.01); *H01L 27/10844* (2013.01); *H01L 27/10894* (2013.01); *G11C 11/4094* (2013.01); *G11C 11/4097* (2013.01)

(58) Field of Classification Search
None
See application file for complete search history.

(56) References Cited

U.S. PATENT DOCUMENTS 8,455,325 B2  6/2013  Fukuda
8,470,714 B1  6/2013  Tsai
8,674,413 B1  3/2014  Chi
(Continued)

OTHER PUBLICATIONS

Po Cheng Huang et al., "Extra treatment to solve Fin damage issue", Invention Disclosure, Dec. 10, 2014, p. 1-22.

(Continued)

*Primary Examiner* — Mounir S Amer
(74) *Attorney, Agent, or Firm* — Winston Hsu

(57) ABSTRACT

A manufacturing method of an epitaxial contact structure in a semiconductor memory device includes the following steps. A recess is formed in a semiconductor substrate by an etching process. An etching defect is formed in the recess by the etching process. An oxidation process is performed after the etching process. An oxide layer is formed in the recess by the oxidation process, and the etching defect is encompassed by the oxide layer. A cleaning process is performed after the oxidation process. The oxide layer and the etching defect encompassed by the oxide layer are removed by the cleaning process. An epitaxial growth process is performed to form an epitaxial contact structure in the recess after the cleaning process.

20 Claims, 9 Drawing Sheets

(56) References Cited

U.S. PATENT DOCUMENTS

| | | |
|---|---|---|
| 2011/0097889 A1 | 4/2011 | Yuan |
| 2012/0319201 A1* | 12/2012 | Sun ................. H01L 21/823487 |
| | | 257/338 |
| 2013/0288480 A1* | 10/2013 | Sanchez ............ H01L 21/02532 |
| | | 438/694 |
| 2015/0187896 A1* | 7/2015 | Kamineni ......... H01L 29/41791 |
| | | 257/288 |
| 2017/0179137 A1* | 6/2017 | Allegret-Maret ........................... |
| | | H01L 27/1104 |
| 2018/0025901 A1* | 1/2018 | Park ................. H01L 21/02057 |

OTHER PUBLICATIONS

Rung Yuan Lee et al., "Method for FINFET sructure formation", Invention Disclosure, Jun. 7, 2017, p. 1-16.
Tseng, Title of Invention: Semiconductor Device and Method for Fabricating the Same, U.S. Appl. No. 14/981,929, filed Dec. 29, 2015.

* cited by examiner

MANUFACTURING METHOD OF EPITAXIAL CONTACT STRUCTURE IN SEMICONDUCTOR MEMORY DEVICE

BACKGROUND OF THE INVENTION

1. Field of the Invention

The present invention relates to a manufacturing method of an epitaxial contact structure in a semiconductor memory device, and more particularly, to a manufacturing method capable of improving a growth quality of an epitaxial contact structure.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series. There are many kinds of structures for the transistor and the capacitor in the memory cell. For lowering the contact resistance between the semiconductor material and an electrical connection part contacting the semiconductor material, an epitaxial contact material may be formed on the semiconductor material by an epitaxial growth. In some processes, a semiconductor substrate is etched to form a recess in the semiconductor substrate, and an epitaxial contact structure is formed in the recess by an epitaxial growth. However, the epitaxial growth tends to be influenced by the surface condition of the recess, impurities on the surface of the recess, and defects on the surface of the recess, and the manufacturing yield will be directly influenced when the quality criteria of the epitaxial structure formed by the epitaxial growth cannot be met.

SUMMARY OF THE INVENTION

A manufacturing method of an epitaxial contact structure in a semiconductor memory device is provided in the present invention. An oxidation process is used to form an oxide layer encompassing an etching defect generated by an etching process, and a cleaning process is used to remove the etching defect encompassed by the oxide layer for avoiding the influence of the etching defect on an epitaxial growth quality of an epitaxial contact structure. The manufacturing yield may be enhanced and the electrical performance of the semiconductor memory device may be improved accordingly.

According to an embodiment of the present invention, a manufacturing method of an epitaxial contact structure in a semiconductor memory device is provided. The manufacturing method includes the following steps. A recess is formed in a semiconductor substrate by an etching process. An etching defect is formed in the recess by the etching process. An oxidation process is performed after the etching process. An oxide layer is formed in the recess by the oxidation process, and the etching defect is encompassed by the oxide layer. A cleaning process is performed after the oxidation process. The oxide layer and the etching defect encompassed by the oxide layer are removed by the cleaning process. An epitaxial growth process is performed to form an epitaxial contact structure in the recess after the cleaning process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating the manufacturing method of the epitaxial contact structure in the semiconductor memory device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a top view diagram of a part of the semiconductor memory device, FIG. 7 is a cross-sectional diagram taken along a line A-A' in FIG. 6, and FIG. 8 is a schematic drawing in a step subsequent to FIG. 7.

DETAILED DESCRIPTION

Figure 1:
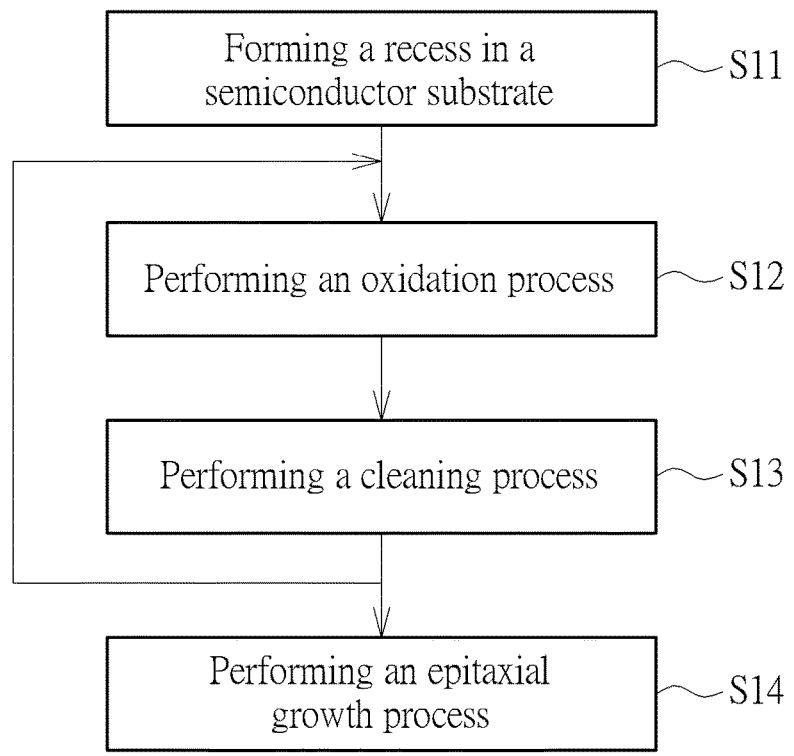
FIG. 1 is a flow chart of a manufacturing method of a manufacturing method of an epitaxial contact structure in a semiconductor memory device according to a first embodiment of the present invention.
Figure 2:
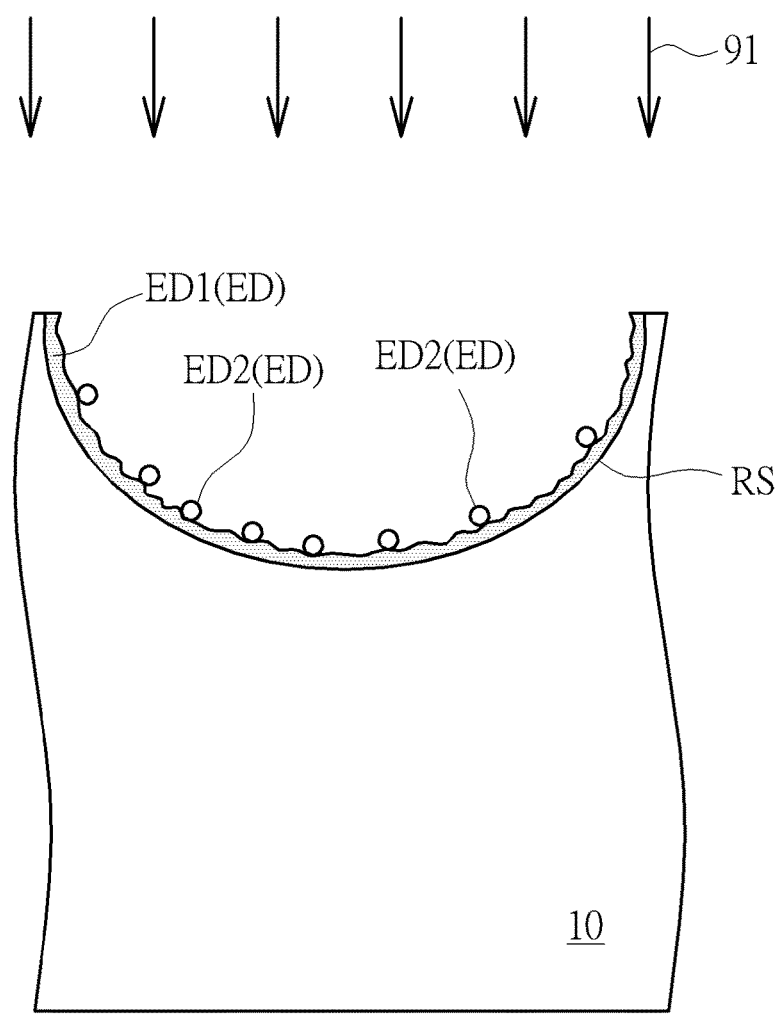

Please refer to FIGS. 1-8. FIG. 1 is a flow chart of a manufacturing method of a manufacturing method of an epitaxial contact structure in a semiconductor memory device according to a first embodiment of the present invention, and FIGS. 2-8 are schematic drawings illustrating the manufacturing method of the epitaxial contact structure in the semiconductor memory device according to this first embodiment. In this embodiment, the manufacturing method of the epitaxial contact structure in the semiconductor memory device may include the following steps. As shown in FIG. 1 and FIG. 2, in step S11, a recess RS is formed in a semiconductor substrate 10 by an etching process 91. An etching defect ED is formed in the recess RS by the etching process 91. In some embodiments, the semiconductor substrate 10 may include a silicon substrate, an epitaxial silicon substrate, a silicon germanium substrate, a silicon carbide substrate, or a silicon-on-insulator (SOI) substrate, but not limited thereto. The etching process 91 may include a dry etching process and/or a wet etching process. In some embodiments, the etching defect ED may include an impurity and/or a damage layer generated by the etching process 91. For example, the etching defect ED may include a non-silicon impurity ED2 or a silicon damage layer ED1 when the semiconductor substrate 10 is a semiconductor substrate containing silicon, but not limited thereto. The non-silicon impurity ED2 may include a polymer impurity or other kinds of non-silicon impurity. A surface of the silicon damage layer ED1 may be attacked by the etching process 91 and may be apparently rough.

Figure 3:
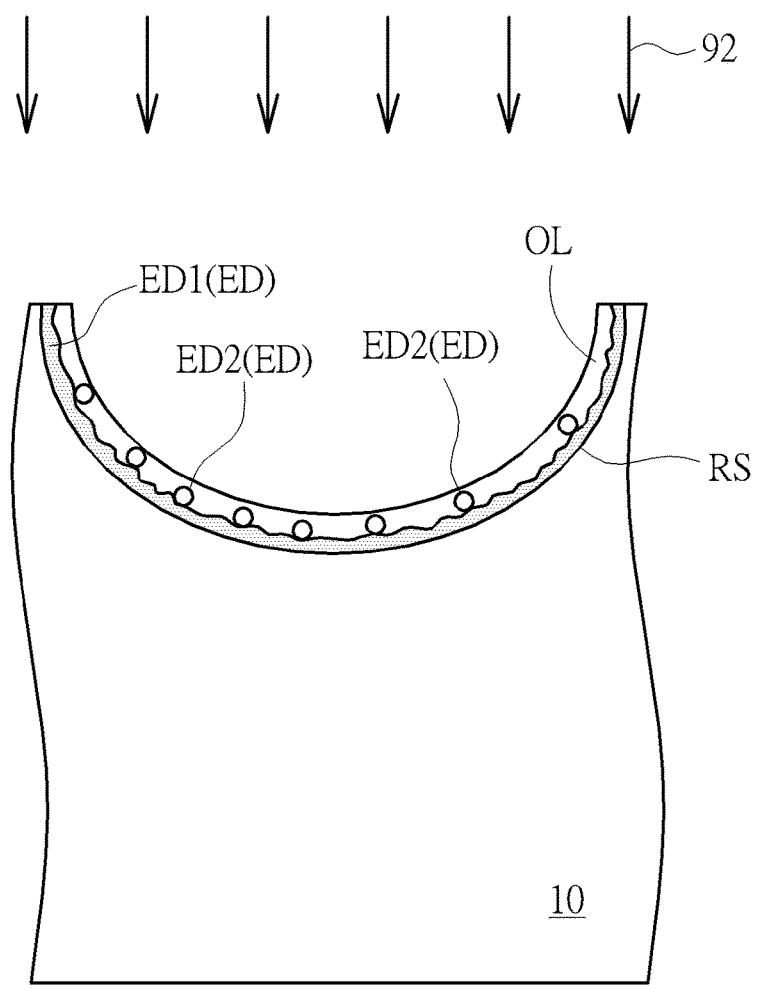

As shown in FIGS. 1-3, step S12 is performed after step S11, wherein an oxidation process 92 is performed after the etching process 91. An oxide layer OL is formed in the recess RS by the oxidation process 92, and the etching defect ED is encompassed by the oxide layer OL. In some embodiments, the oxidation process 92 may include a wet oxidation process, and an oxidation agent used in the oxidation process 92 may include hydrogen peroxide ($H_2O_2$), ozone ($O_3$) water, or other appropriate oxidation media, but not limited thereto. In some embodiments, other kind of oxidation process 92, such as a dry oxidation process, may also be applied to form the oxide layer OL encompassing the etching defect ED. It is worth noting that at least some of the etching defects ED such as the non-silicon impurity ED2 may be encompassed and covered by the oxide layer OL, and a part of the oxide layer OL may be embedded in the uneven part of the surface of the silicon damage layer ED1 for ensuring that the oxide layer OL and the etching defect ED encompassed by the oxide layer OL may be removed together in a cleaning process subsequently performed by the connection between the oxide layer OL and the etching defect ED. In other words, the oxide layer OL has to be thick enough for effectively encompassing the etching defect ED. For example, in some embodiments, the thickness of the oxide layer OL may be larger than the thickness of the silicon damage layer ED1, but not limited thereto.

Figure 4:
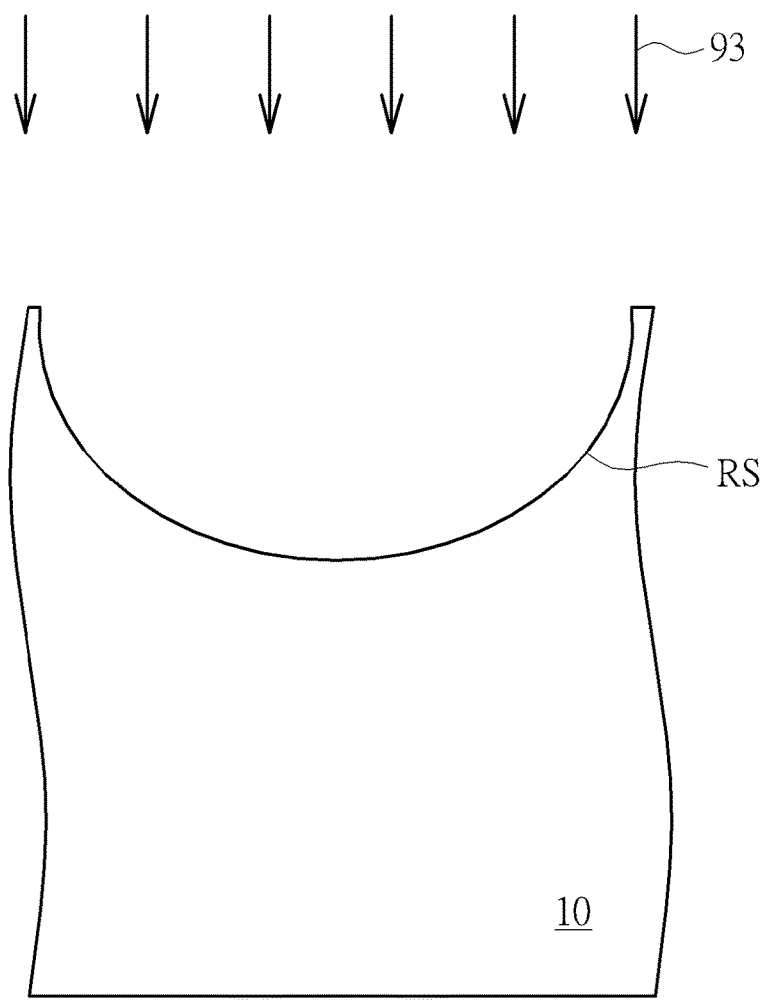

As shown in FIG. 1, FIG. 3, and FIG. 4, step S13 is performed after step S12, wherein a cleaning process 93 is performed after the oxidation process 92. The oxide layer OL and the etching defect ED encompassed by the oxide layer OL are removed by the cleaning process 93. In some embodiments, the cleaning process 93 may include a dry cleaning process and/or a wet cleaning process. A process gas used in the dry cleaning process mentioned above may include nitrogen trifluoride (NF3) or other suitable gases. In some embodiments, the dry cleaning process mentioned above may include a dry cleaning process using a gaseous mixture of nitrogen trifluoride and nitrogen trihydride ($NH_3$), such as a SiCoNi cleaning process, but not limited thereto. Additionally, the wet cleaning process mentioned above may include a standard clean 1 (SC1) process, a dilute hydrogen fluoride (DHF) cleaning process, or other suitable wet cleaning processes. A mixture of ammonium hydroxide ($NH_4OH$), hydrogen peroxide ($H_2O_2$), and deionized water may be used in the SC1 process mentioned above for cleaning.

Figure 5:
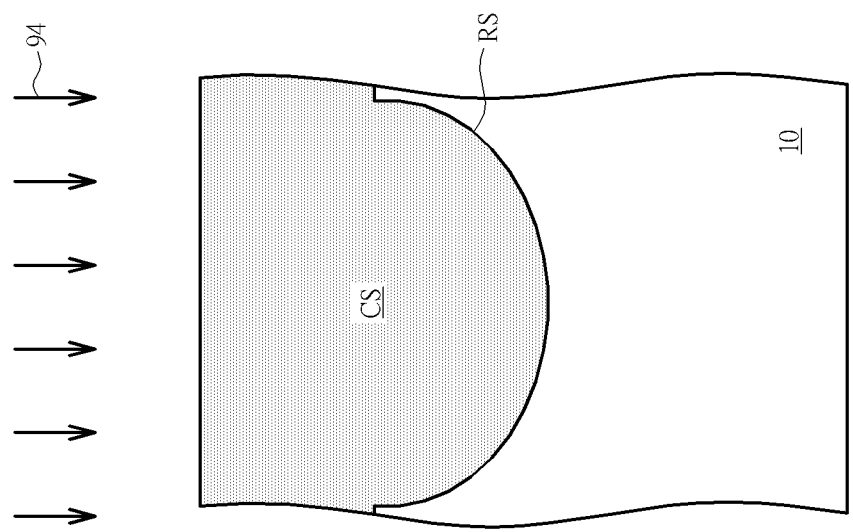

As shown in FIG. 1, FIG. 4 and FIG. 5, step S14 is performed after step S13, wherein an epitaxial growth process 94 is performed to form an epitaxial contact structure CS in the recess RS after the cleaning process 93. In some embodiments, the epitaxial growth process 94 may include a selective epitaxial growth (SEG) process, and the epitaxial contact structure CS may include a silicon germanium (SiGe) epitaxial structure, a silicon carbide (SiC) epitaxial structure, or other appropriate epitaxial structures. Additionally, an in-situ ion implantation process may be performed before the epitaxial growth process 94, after the epitaxial growth process 94, or in the epitaxial growth process 94 for implanting required dopants into the epitaxial contact structure CS. In addition, as shown in FIGS. 1-5, the oxidation process 92 in step S12 and the cleaning process 93 in step S13 may be performed repeatedly after the etching process 91 in step S11 and before the epitaxial growth process 94 in step S14 for enhancing the performance of removing the etching defect ED and the oxide layer OL. In other words, the oxidation process 92 and the cleaning process 93 may be performed repeatedly before the epitaxial growth process 94 for enhancing the performance of removing the etching defect ED and the oxide layer OL, and the epitaxial quality of the epitaxial contact structure CS may be improved accordingly, but not limited thereto.

Figure 6:
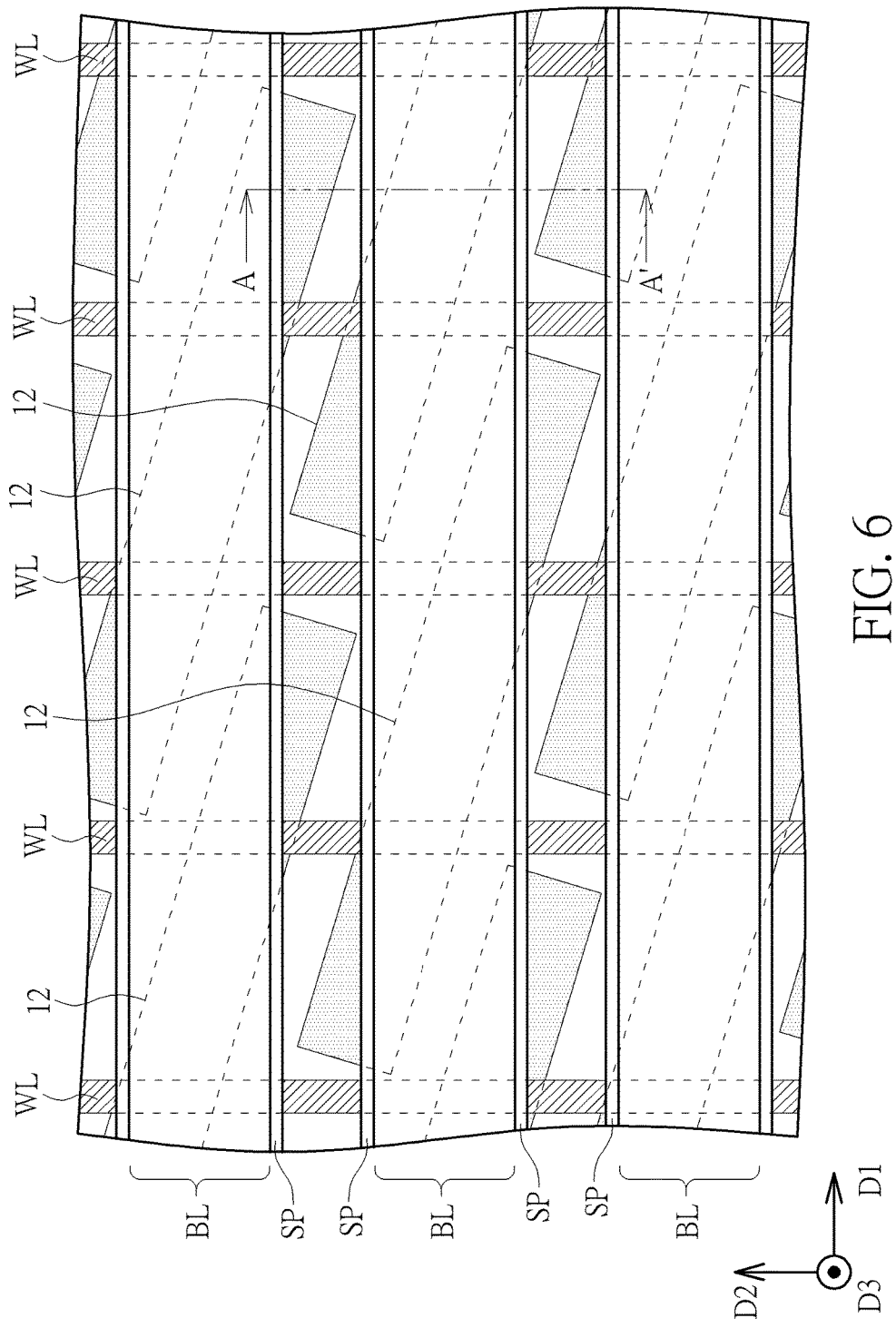
Figure 7:
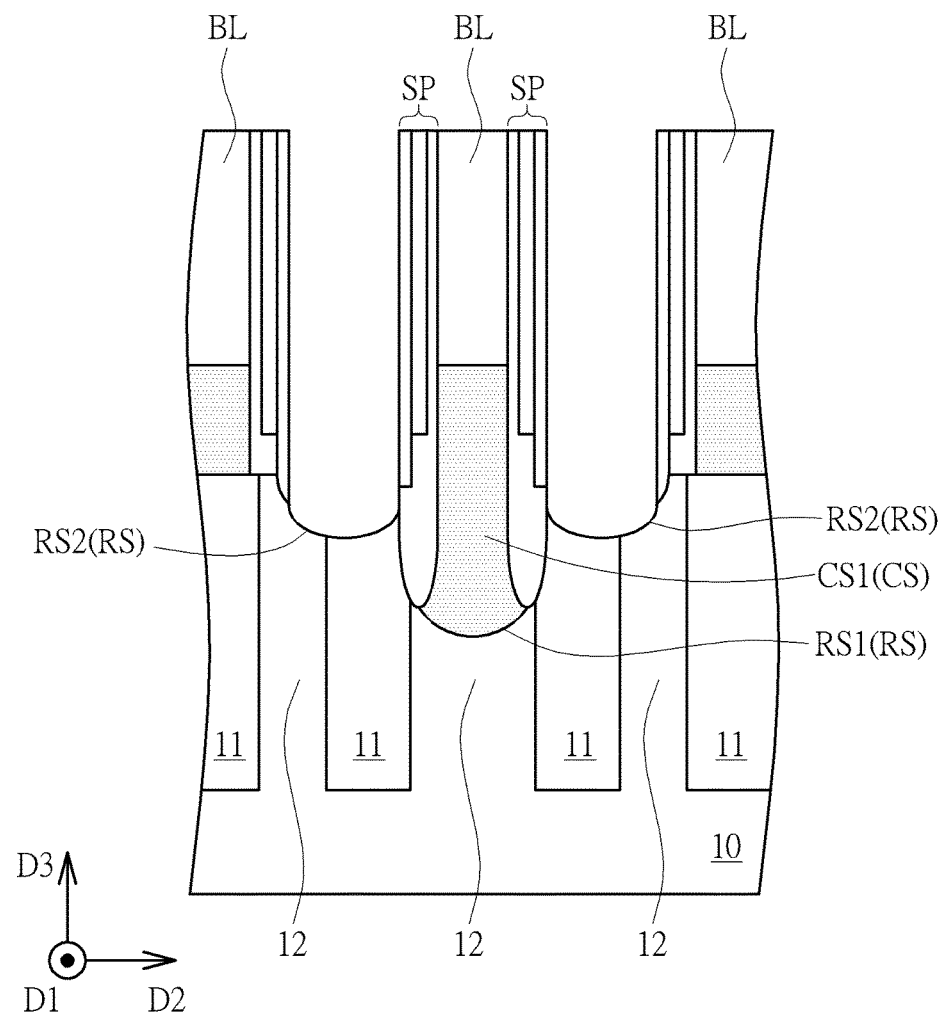

As shown in FIGS. 5-7, in some embodiments, a shallow trench isolation 11 may be formed in the semiconductor substrate 10 for defining a plurality of active areas 12 in the semiconductor substrate 10. The shallow trench isolation 11 may be formed by etching the semiconductor 10 for forming a plurality of trenches and filling the trenches with an insulation material such as silicon oxide, but not limited thereto. In some embodiments, other suitable approaches may also be applied to form the shallow trench isolation 11. Additionally, in some embodiments, a plurality of word lines WL may be formed. The word lines WL may include buried word lines, and the word lines WL may be buried in the semiconductor substrate 10 and the shallow trench isolation 11, but not limited thereto. In addition, a plurality of bit line structures BL may be formed on the semiconductor substrate 10, and a spacer SP may be formed on sidewalls of the bit line structures BL, but not limited thereto. In some embodiments, the spacer SP may be composed of multiple layers of insulation materials, and each of the bit line structures BL may include materials layers such as a non-metal conductive layer, a barrier layer, and a metal layer (not shown) stacked with one another in a thickness direction of the semiconductor substrate 10 (such as a third direction D3 shown in FIG. 7). Each of the bit line structures BL may extend in a first direction D1, and the bit line structures BL may be repeatedly arranged in the second direction D2, but not limited thereto. Additionally, each of the word lines WL may extend in the second direction D2, the word liens WL may be repeatedly arranged in the first direction D1, and the first direction D1 may be substantially perpendicular to the second direction D2, but not limited thereto.

In some embodiments, the epitaxial contact structure CS mentioned above may be located between the semiconductor substrate 10 and one of the bit line structures BL in the third direction D3, and the recess RS mentioned above may include a first recess RS1 located in the semiconductor substrate 10 under the corresponding bit line structure BL. In other words, the recess RS and the epitaxial contact structure CS mentioned above may be formed before the step of forming the bit line structures BL, and one of the bit line structures BL may be electrically connected with the epitaxial contact structure CS. In this condition, the epitaxial contact structure CS may be regarded as a bit line contact structure CS1, and the manufacturing method of forming the epitaxial contact structure CS may be used to form the bit line contact structure CS1. The epitaxial quality of the bit line contact structure CS1 may be improved, and the electrical connection between the bit line structure BL and the corresponding active area 12 via the bit line contact structure CS1 may be improved accordingly.

Figure 8:
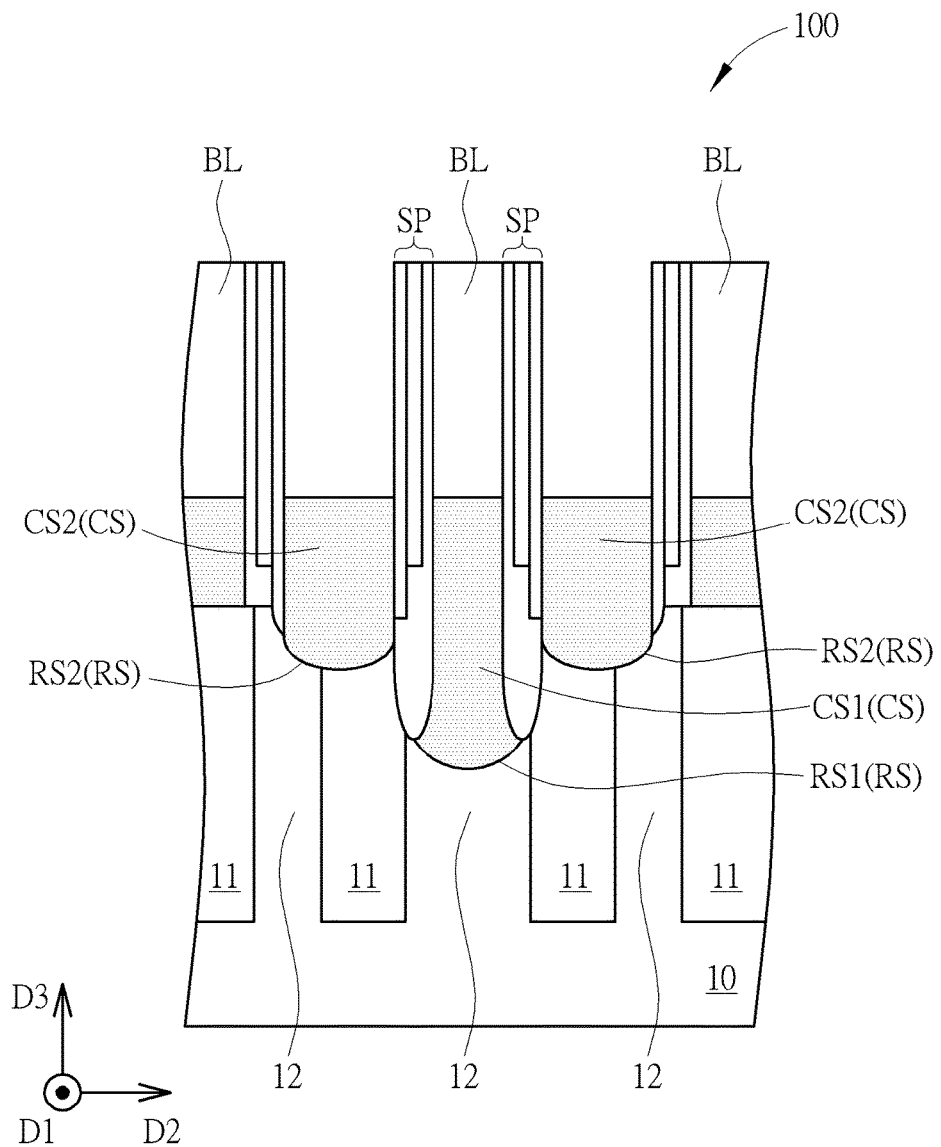

As shown in FIG. 7 and FIG. 8, the recess RS mentioned above may include a second recess RS2, and the epitaxial contact structure CS mentioned above may include a storage node contact structure CS2 formed in the second recess RS2. When the epitaxial contact structure CS is the storage node contact structure CS2, the recess RS and the epitaxial contact structure CS may be formed after the step of forming the bit line structures BL. The epitaxial contact structure CS may be located between two adjacent bit line structures in the second direction D2, and the epitaxial contact structure CS may be electrically isolated from the bit line structures BL. In other words, in some embodiments, the manufacturing method of forming the epitaxial contact structure CS mentioned above may also be used to form the storage node contact structure CS2. The epitaxial quality of the storage node contact structure CS2 may be improved, and the electrical connection between a capacitor structure corresponding to the storage node contact structure CS2 and the corresponding active area 12 via the storage node contact structure CS2 may be improved accordingly.

A semiconductor memory device 100 shown in FIG. 8 may be formed by the manufacturing method described above. In some embodiments, the manufacturing method of the epitaxial contact structure CS mentioned above may be used to form the bit line contact structure CS1 and/or the storage node contact structure CS2 in the semiconductor memory device for improving the epitaxial quality of the epitaxial contact structure CS in the semiconductor memory device 100. The manufacturing yield of the semiconductor memory device 100 may be enhanced and the electrical performance of the semiconductor memory device 100 may be improved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
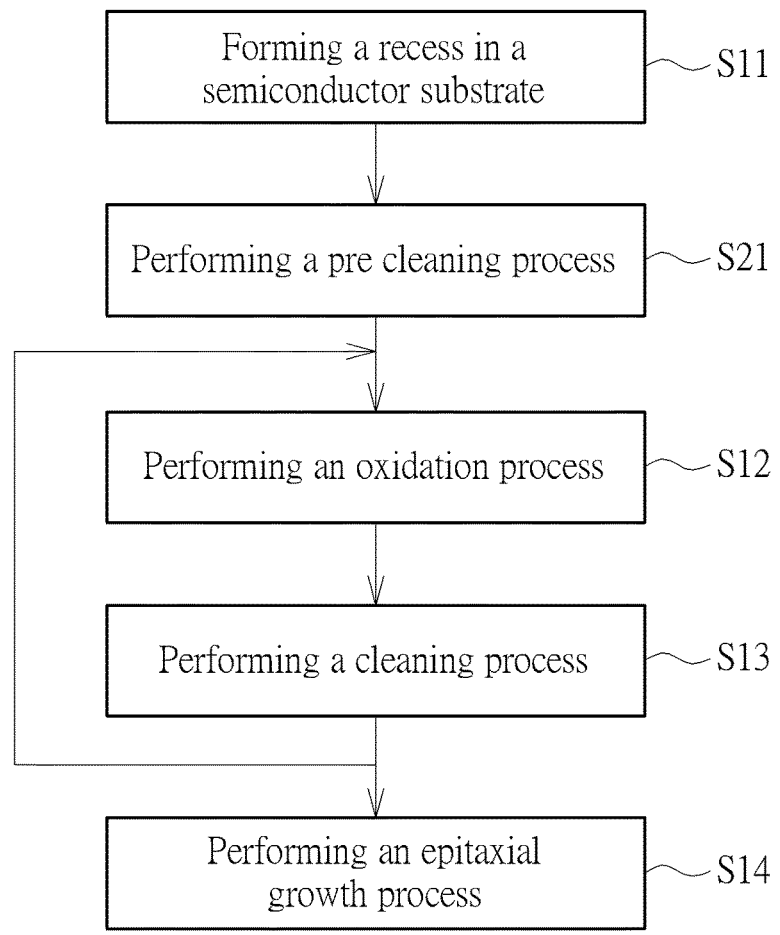
FIG. 9 is a schematic drawing illustrating a manufacturing method of an epitaxial contact structure in a semiconductor memory device according to a second embodiment of the present invention.

Please refer to FIG. 9 and FIGS. 2-5. FIG. 9 is a schematic drawing illustrating a manufacturing method of an epitaxial contact structure in a semiconductor memory device according to a second embodiment of the present invention. As shown in FIG. 9, the difference between the manufacturing method in this embodiment and the manufacturing method in the first embodiment mentioned above is that the manufacturing method in this embodiment may further include step S21 performed after step S11 and before step S12, wherein a pre cleaning process is performed before the oxidation process 92, and the pre cleaning process is different from the oxidation process 92. In some embodiments, the pre cleaning process may include a piranha clean (SPM clean) process, a SC1 process, a DHF cleaning process, or other suitable cleaning processes. A mixture of sulfuric acid ($H_2SO_4$), hydrogen peroxide ($H_2O_2$), and deionized water may be used in the SPM clean process mentioned above for cleaning. The pre cleaning process mentioned above may be used to remove at least a part of impurities such as polymer impurities and/or particles before the oxidation process 92. That will be beneficial for the performance of removing the etching defect ED by the oxidation process 92 and the cleaning process 93 performed subsequently, and the number of repeating the oxidation process 92 and the cleaning process 93 may be reduced accordingly.

To summarize the above descriptions, in the manufacturing method of the epitaxial contact structure in the semiconductor memory device according to the present invention, the oxidation process is used to form the oxide layer encompassing the etching defect generated by the etching process, and the cleaning process is used to remove the etching defect encompassed by the oxide layer for avoiding the influence of the etching defect on the epitaxial growth quality of the epitaxial contact structure. The manufacturing yield of the semiconductor memory device may be enhanced and the electrical performance of the semiconductor memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an epitaxial contact structure in a semiconductor memory device, comprising:
    forming a recess in a semiconductor substrate by an etching process, wherein an etching defect is formed in the recess by the etching process;
    performing an oxidation process after the etching process, wherein an oxide layer is formed in the recess by the oxidation process, and the etching defect is encompassed by the oxide layer;
    performing a cleaning process after the oxidation process, wherein the oxide layer and the etching defect encompassed by the oxide layer are removed by the cleaning process; and
    performing an epitaxial growth process to form an epitaxial contact structure in the recess after the cleaning process, wherein the oxidation process and the cleaning process are performed repeatedly before the epitaxial growth process.

2. The manufacturing method of the epitaxial contact structure in the semiconductor memory device according to claim 1, wherein an oxidation agent used in the oxidation process comprises hydrogen peroxide ($H_2O_2$) or ozone ($O_3$) water.

3. The manufacturing method of the epitaxial contact structure in the semiconductor memory device according to claim 1, wherein the cleaning process comprises a dry cleaning process.

4. The manufacturing method of the epitaxial contact structure in the semiconductor memory device according to claim 3, wherein a process gas used in the dry cleaning process comprises nitrogen trifluoride ($NF_3$).

5. The manufacturing method of the epitaxial contact structure in the semiconductor memory device according to claim 1, wherein the cleaning process comprises a standard clean 1 (SC1) process or a dilute hydrogen fluoride (DHF) cleaning process.

6. The manufacturing method of the epitaxial contact structure in the semiconductor memory device according to claim 1, further comprising:
    performing a pre cleaning process before the oxidation process, wherein the pre cleaning process is different from the oxidation process.

7. The manufacturing method of the epitaxial contact structure in the semiconductor memory device according to claim 6, wherein the pre cleaning process comprises a piranha clean (SPM clean) process, a SC1 process, or a DHF cleaning process.

8. The manufacturing method of the epitaxial contact structure in the semiconductor memory device according to claim 1, wherein the etching defect comprises a non-silicon impurity or a silicon damage layer.

9. The manufacturing method of the epitaxial contact structure in the semiconductor memory device according to claim 1, further comprising:
    forming a plurality of bit line structures on the semiconductor substrate.

10. The manufacturing method of the epitaxial contact structure in the semiconductor memory device according to claim 9, wherein the recess and the epitaxial contact structure are formed before the step of forming the bit line structures, and one of the bit line structures is electrically connected with the epitaxial contact structure.

11. The manufacturing method of the epitaxial contact structure in the semiconductor memory device according to claim 9, wherein the recess and the epitaxial contact structure are formed after the step of forming the bit line structures.

12. The manufacturing method of the epitaxial contact structure in the semiconductor memory device according to claim 11, wherein the epitaxial contact structure is electrically isolated from the bit line structures.

13. The manufacturing method of the epitaxial contact structure in the semiconductor memory device according to claim 11, wherein the epitaxial contact structure comprises a storage node contact structure.

14. A manufacturing method of an epitaxial contact structure in a semiconductor memory device, comprising:
   forming a recess in a semiconductor substrate by an etching process, wherein an etching defect is formed in the recess by the etching process;
   performing an oxidation process after the etching process, wherein an oxide layer is formed in the recess by the oxidation process, and the etching defect is encompassed by the oxide layer;
   performing a cleaning process after the oxidation process, wherein the oxide layer and the etching defect encompassed by the oxide layer are removed by the cleaning process;
   performing an epitaxial growth process to form an epitaxial contact structure in the recess after the cleaning process; and
   performing a pre cleaning process before the oxidation process, wherein the pre cleaning process is different from the oxidation process.

15. The manufacturing method of the epitaxial contact structure in the semiconductor memory device according to claim 14, wherein an oxidation agent used in the oxidation process comprises hydrogen peroxide ($H_2O_2$) or ozone ($O_3$) water.

16. The manufacturing method of the epitaxial contact structure in the semiconductor memory device according to claim 14, wherein the cleaning process comprises a dry cleaning process.

17. The manufacturing method of the epitaxial contact structure in the semiconductor memory device according to claim 16, wherein a process gas used in the dry cleaning process comprises nitrogen trifluoride ($NF_3$).

18. The manufacturing method of the epitaxial contact structure in the semiconductor memory device according to claim 14, wherein the cleaning process comprises a standard clean 1 (SC1) process or a dilute hydrogen fluoride (DHF) cleaning process.

19. The manufacturing method of the epitaxial contact structure in the semiconductor memory device according to claim 14, wherein the pre cleaning process comprises a piranha clean (SPM clean) process, a SC1 process, or a DHF cleaning process.

20. A manufacturing method of an epitaxial contact structure in a semiconductor memory device, comprising:
   forming a recess in a semiconductor substrate by an etching process, wherein an etching defect is formed in the recess by the etching process;
   performing an oxidation process after the etching process, wherein an oxide layer is formed in the recess by the oxidation process, and the etching defect is encompassed by the oxide layer;
   performing a cleaning process after the oxidation process, wherein the oxide layer and the etching defect encompassed by the oxide layer are removed by the cleaning process;
   performing an epitaxial growth process to form an epitaxial contact structure in the recess after the cleaning process; and
   forming a plurality of bit line structures on the semiconductor substrate, wherein the recess and the epitaxial contact structure are formed after the step of forming the bit line structures.

* * * * *